(12) United States Patent
Jeon et al.

(10) Patent No.: US 7,345,336 B2
(45) Date of Patent: Mar. 18, 2008

(54) SEMICONDUCTOR MEMORY DEVICE HAVING SELF-ALIGNED CHARGE TRAPPING LAYER

(75) Inventors: Hee-seog Jeon, Hwaseong-si (KR); Seung-beom Yoon, Suwon-si (KR); Yong-tae Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/000,011

(22) Filed: Dec. 1, 2004

(65) Prior Publication Data

US 2005/0133849 A1   Jun. 23, 2005

(30) Foreign Application Priority Data

Dec. 17, 2003   (KR) ............... 10-2003-0092502

(51) Int. Cl.
   *H01L 29/792* (2006.01)
(52) U.S. Cl. ............... 257/324; 257/E29.309; 257/314
(58) Field of Classification Search ........ 257/297, 257/304, E27.09, E21.626, E21.64, E29.315, 257/314, 324–326, E29.309; 438/264, 261, 438/257
   See application file for complete search history.

(56) References Cited

U.S. PATENT DOCUMENTS

| 5,652,179 | A* | 7/1997 | Strifler et al. ......... 438/578 |
|---|---|---|---|
| 6,335,554 | B1* | 1/2002 | Yoshikawa ............ 257/316 |
| 6,812,097 | B2* | 11/2004 | Shibata .................. 438/257 |
| 7,015,541 | B2* | 3/2006 | Kim et al. .............. 257/324 |
| 2003/0032243 | A1* | 2/2003 | Ogura et al. ........... 438/257 |
| 2003/0134475 | A1* | 7/2003 | Hofmann et al. ...... 438/257 |

FOREIGN PATENT DOCUMENTS

| JP | 15-258128 | 9/2003 |
|---|---|---|
| JP | 15-258132 | 9/2003 |
| JP | 15-282744 | 10/2003 |
| KR | P2003-0019585 | 3/2003 |

OTHER PUBLICATIONS

Li et al. Damascene W/TiN Gate Mosfets with Improved Performance. IEEE Transactions on Electron Devices, vol. 49, No. 11, Nov. 2002.*
Lubarsky et al. Quantitative evaluation of local charge trapping in dielectric stacked gate structures using Kelvin probe force microscopy. J. Vac. Sci. Technol. B 20(5), Sep./Oct. 2002.*

* cited by examiner

*Primary Examiner*—Matthew C. Landau
(74) *Attorney, Agent, or Firm*—Volentine & Whitt, PLLC

(57) ABSTRACT

A semiconductor memory device having a self-aligned charge trapping layer and a method of manufacturing the same in which a consistent length of an ONO layer is ensured. Here, an insulating stacked structure is self-aligned to a bottom surface of conductive spacers.

17 Claims, 8 Drawing Sheets

SEMICONDUCTOR MEMORY DEVICE HAVING SELF-ALIGNED CHARGE TRAPPING LAYER

BACKGROUND OF THE INVENTION

1. Field of the Invention

The present invention relates to a semiconductor memory device and a method of manufacturing the same. More particularly, the present invention relates to a semiconductor memory device having a charge trapping layer formed via self-alignment and a method of manufacturing the same.

A claim of priority is made to Korean Patent Application No. 2003-92502 filed on Dec. 17, 2003, the disclosure of which is incorporated herein by reference in its entirety.

2. Description of the Related Art

A nonvolatile memory device retains stored data even in the absence of a power supply. A Silicon-Oxide-Nitride-Oxide-Silicon (SONOS) nonvolatile memory device with an Oxide-Nitride-Oxide (ONO) structure capable of trapping charges and having a single MOSFET gate electrode is disclosed, for example, in U.S. Pat. No. 5,768,192. The SONOS nonvolatile memory device is readily manufactured and integrated within a peripheral region and/or a logic region of an integrated circuit.

However, in the conventional SONOS nonvolatile memory device, the ONO layer is provided on the entire surface of a channel region. This configuration increases the overall thickness of an effective oxide layer of a gate oxide layer. For this reason, the SONOS nonvolatile memory device has a high initial threshold voltage, a correspondingly high electric power dissipation, and high programming current. Furthermore, electrons trapped by a silicon nitride layer are apt to move horizontally along the silicon nitride layer. As a result, the time required to erase data in the nonvolatile memory device ("erasure time") increases. Also, an initial threshold voltage (Vth) associated with an erased cell is likely to increase after repeated programming and erasing operations. Accordingly, on-cell current and readout speed may degrade over time along with a general ability to retain data.

To solve these problems, a conventional local SONOS nonvolatile memory device has been suggested in which a charge trapping layer, i.e., a silicon nitride layer, partially overlaps a gate electrode. Hereinafter, the conventional local SONOS nonvolatile memory device will be described with reference to FIGS. 1 through 4.

Referring to FIG. 1, first silicon oxide layer 12, silicon nitride layer 14, and second silicon oxide layer 16 are sequentially stacked on an upper surface of silicon substrate 10. Then, to pattern second silicon oxide layer 16, silicon nitride layer 14 and first silicon oxide layer 12, first photoresist pattern 18 is formed via a typical photolithography process. An exposed portion of second silicon oxide layer 16, silicon nitride layer 14, and first silicon oxide layer 12 are etched using first photoresist pattern 18 as an etch mask.

As shown in FIG. 2, after removing first photoresist pattern 18, gate oxide layer 20 is deposited on an upper surface of the resultant structure. By doing so, a portion of silicon substrate 10 is covered by gate oxide layer 20 and the other portion thereof is covered by ONO layer 22.

Referring to FIG. 3, polysilicon layer 24 is deposited on an upper surface of gate oxide layer 20 and ONO layer 22. Second photoresist pattern 26 for defining a gate electrode is formed on an upper surface of polysilicon layer 24.

As shown in FIG. 4, polysilicon layer 24 and ONO layer 22 are patterned using second photoresist pattern 26 as an etch mask to define gate electrode 25. Thereafter, second photoresist pattern 26 is removed. Gate electrode 25 overlaps both gate oxide layer 20 and ONO layer 22. Then, impurities are implanted into silicon substrate 10 at both outward edges of gate electrode 25 to form source and drain regions 28a and 28b. When two memory cells are formed to compose gate electrode 25 as described above, it is referred to as a 2-bit formation.

ONO layer 22 partially overlaps gate electrode 25 to lower an initial threshold voltage and reduce erasure time.

However, the foregoing conventional local SONOS nonvolatile memory device experiences problems resulting from the inconsistent formation of ONO layer 22 using the foregoing photolithography process.

As described above, the length of ONO layer 22 is determined by first and second photoresist patterns 18 and 26. However, the second photoresist pattern 26 that defines gate electrode 25 may be misaligned as shown by the pattern offset 26a in FIG. 3, while performing the photolithography process. This offset results in a variation of the length of ONO layer 22. In more detail, once polysilicon layer 24 and ONO layer 22 are patterned by an offset second photoresist pattern 26a, misalignment of the lengths of ONO layer 22, i.e., lengths L1 and L2 overlapping gate electrode 25 as shown in FIG. 5, may be different from each other. Here, respective memory cells are designated as even and odd cells. Accordingly, the lengths of ONO layer 22 differ between the even and odd cells.

If the lengths of ONO layer 22 are different from each other, the memory devices connected to ONO layer 22 may have different threshold voltages and erasure speeds. Consequently, the uniformity of nonvolatile memory device performance is degraded and the threshold voltage varies greatly.

It will be understood that when an element such as layer, region or substrate is referred to as being "on" or "onto" another element, the element is either directly on the other element or intervening elements may also be present.

SUMMARY OF THE INVENTION

The present invention provides a semiconductor memory device comprising a self-aligned charge trapping layer and an ONO layer having uniform length.

The present invention also provides a method of manufacturing a semiconductor memory device comprising a self-aligned charge trapping layer in which variations in length of an ONO layer caused by misalignment are prevented.

According to one aspect of the present invention, there is provided a semiconductor memory device including a self-aligned charge trapping layer, comprising a gate electrode, a pair of conductive spacers are formed on both sidewalls of the gate electrode. Also, a pair of charge trapping layers are formed between the semiconductor substrate and conductive spacers and are self-aligned to bottom surfaces of the conductive spacers.

It is preferable that lengths of the charge trapping layers are equal to each other and to a bottom length of the conductive spacer. Here, upper and lower layers of the charge trapping layer are oxide layers, thus resulting in an ONO layer.

The gate electrode includes a first gate electrode formed in a lower portion of a groove disposed between the conductive spacers, and a second gate electrode formed in an upper portion of the groove and electrically connecting conductive spacers with the first gate electrode.

Preferably, conductive spacers are spaced apart from each other by a predetermined distance with respect to the first gate electrode.

According to another aspect of the present invention, there is provided a method of manufacturing a semiconductor memory device including a self-aligned charge trapping layer, in which an insulating stacked structure including a charge trapping layer is formed on a semiconductor substrate. An intermediary material pattern is formed on the insulating stacked structure, and conductive spacers are formed on sidewalls of the intermediary material pattern. By removing the intermediary material pattern formed between the conductive spacers and at least one portion of the charge trapping layer below the intermediary material pattern, a groove is formed. After forming a gate electrode electrically connected to the conductive spacers within the groove, the exposed insulating stacked material is partially etched using the conductive spacers as an etch mask to form a self-aligned charge trapping layer pattern below conductive spacers.

According to still another aspect of the present invention, there is provided a method of manufacturing a semiconductor memory device having a self-aligned charge trapping layer, in which a stacked layer having a silicon oxide layer/silicon nitride layer/silicon oxide layer structure is formed on a semiconductor substrate. Then, after forming an intermediary material pattern on the silicon oxide layer, conductive spacers are formed on sidewalls of the intermediary material pattern. The intermediary material pattern formed between the conductive spacers and stacked layer disposed below the intermediary material pattern are removed to form a groove. Thereafter, a gate electrode electrically connected to the conductive spacers is formed within the groove. Then, exposed portions of the silicon nitride layer/silicon oxide layer are etched using the conductive spacers as an etch mask to form a self-aligned charge trapping layer pattern below the conductive spacers. After forming source and/or drain region(s) in regions of the semiconductor substrate adjacent to the conductive spacers, an interlayer insulating layer is formed on the semiconductor substrate. The interlayer insulating layer is etched to expose the drain region, and a bit line is formed in the interlayer insulating layer to contact the exposed drain region.

The formation of the intermediary material pattern includes forming an insulating layer on the insulating stacked structure. Then, a photoresist pattern is formed on the insulating layer to define the intermediary material pattern, and the insulating layer is thereafter removed to expose the insulating stacked structure using a photoresist pattern as an etch mask. Preferably, the insulating stacked structure has an etch selectivity over that of the insulating layer. For example, the insulating stacked material may have a silicon oxide layer/silicon nitride layer/silicon oxide layer structure, and the insulating layer may have a silicon nitride layer structures.

Also, the formation of the conductive spacers includes depositing a conductive spacer material layer on the resultant structure in which the intermediary material pattern thereon is formed on the semiconductor substrate, and forming the conductive spacers by anisotropic dry etching the conductive spacer material layer. It is preferred that the bottom length of the conductive spacers be equal.

The formation of the gate electrode includes forming an interlayer insulating layer on the resultant structure in which the intermediary material pattern is formed on the semiconductor substrate. Intermediary material pattern is then removed via wet etching so as to expose a portion of the insulating stacked structure, and the exposed portion of insulating stacked structure is removed by wet etching or dry etching. After forming the gate insulating layer on the resultant structure thereon, a gate electrode material layer is deposited on the gate insulating layer to fill the groove. Gate electrode material layer is etched to expose the upper surface of the interlayer insulating layer. Also, gate electrode material layer is partially etched to form a first gate electrode in the lower portion of groove, and the gate insulating layer is etched such that an upper surface of gate insulating layer and an upper surface of the first gate electrode form a plane. Thereafter, a second gate electrode is formed in the upper portion of the groove to electrically connect the first gate electrode with the conductive spacers.

Preferably, the intermediary material has an etch selectivity over that of the interlayer insulating layer, and gate electrode material layer has an etch selectivity over that of the gate insulating layer.

The formation of charge trapping layer pattern includes removing the charge stop layer on charge trapping layer using the conductive spacers as an etch mask, and removing charge trapping layer using the conductive spacers as an etch mask.

BRIEF DESCRIPTION OF THE DRAWINGS

The above and other aspects and advantages of the present invention will become more apparent upon consideration of several selected exemplary embodiments thereof with reference to the attached drawings in which.

DETAILED DESCRIPTION OF THE INVENTION

The length of a charge trapping layer in a semiconductor memory device according to the present invention is determined in one aspect by self-alignment using a conductive spacer. By doing so, the length of the charge trapping layer is defined without the use of a plurality of photolithography processes. As a result, length variations in the charge trapping layer caused by photolithography misalignments are prevented. The present invention will be described in conjunction with a 2-bit cell structure, in which a single gate includes two charge trapping layers. However, this is just a selected teaching example. The present invention is not limited to a 2-bit cell structure.

Figure 1:
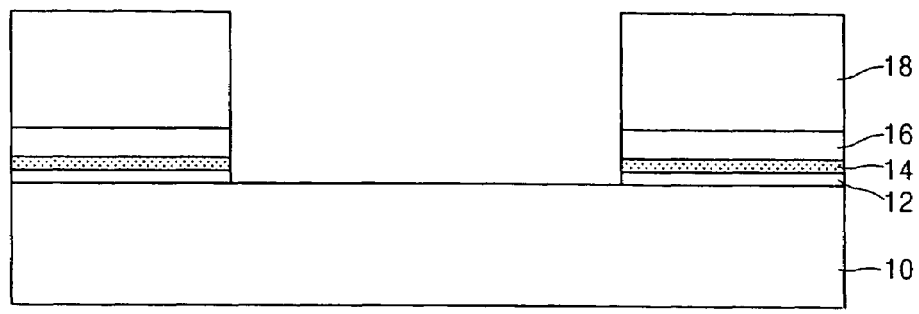
FIGS. 1 through 4 are sectional views illustrating a method of manufacturing a conventional local SONOS nonvolatile memory device.
Figure 2:
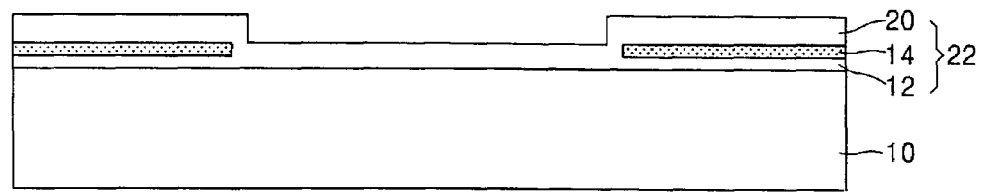
Figure 3:
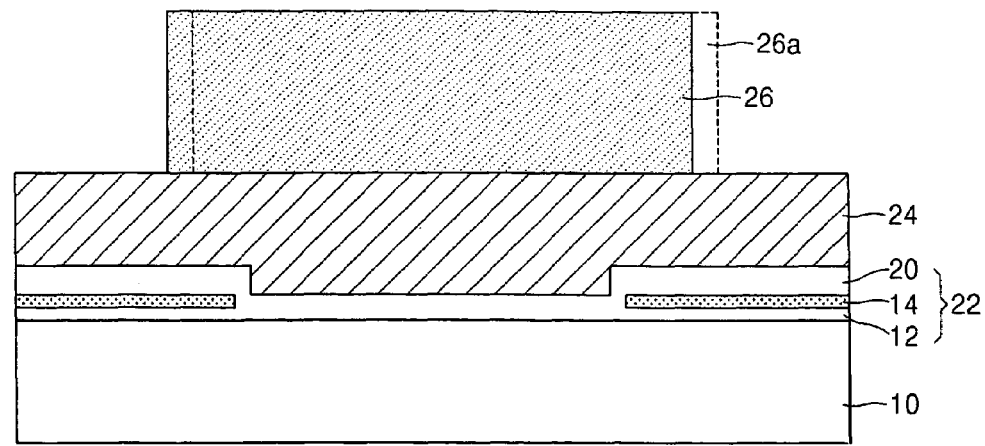
Figure 4:
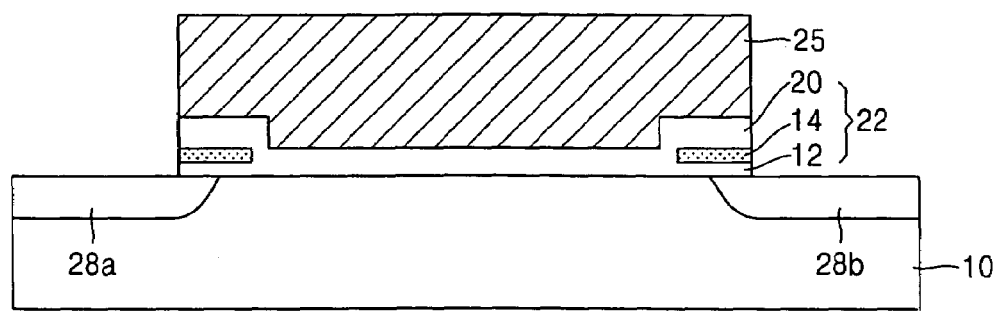
Figure 5:
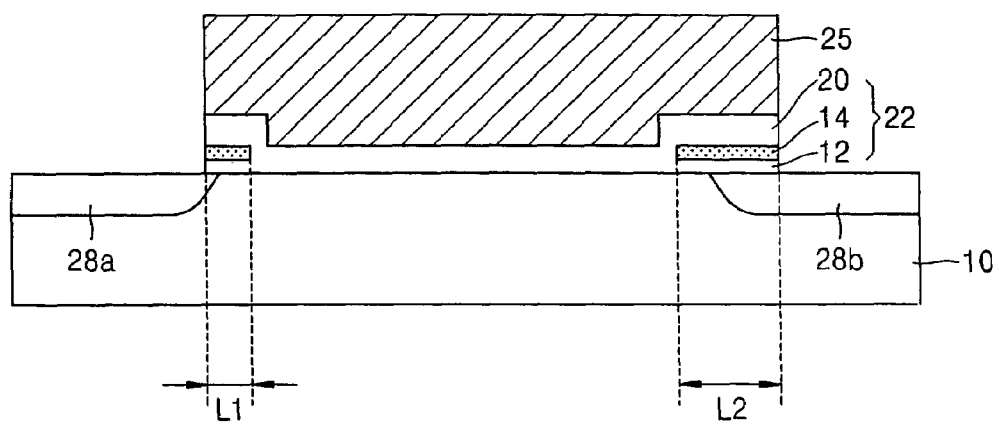
FIG. 5 is a sectional view illustrating a local SONOS nonvolatile memory device suffering from a misalignment caused by the conventional method of manufacture.
Figure 6:
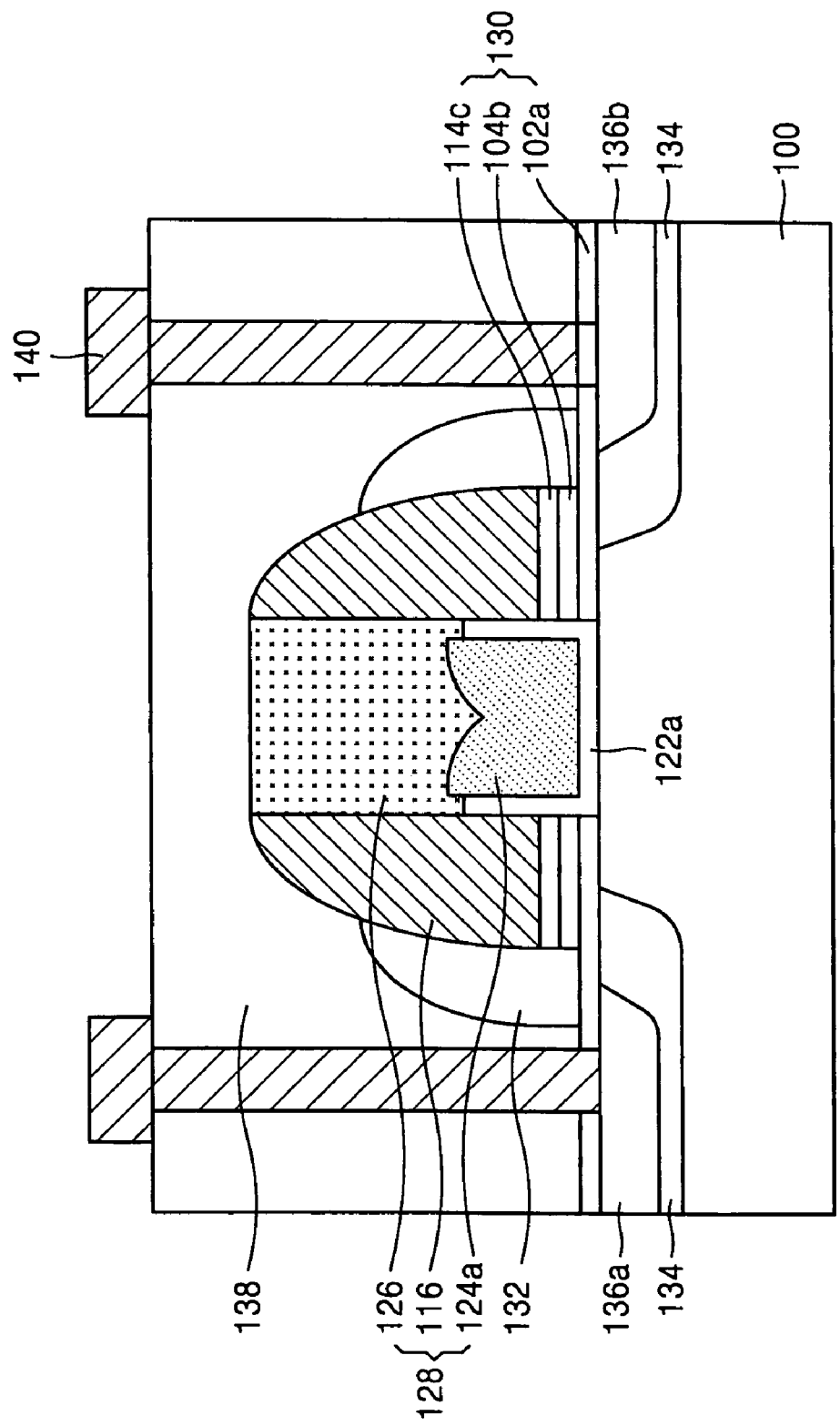
FIG. 6 is a sectional view showing a semiconductor memory device including a self-aligned charge trapping layer in accordance with one embodiment of the present invention.

FIG. 6 is a sectional view showing a semiconductor memory device including a self-aligned charge trapping layer according to one presently preferred embodiment of the invention.

Referring to FIG. 6, the memory device includes semiconductor substrate 100 having source and drain regions 136a and 136b. Semiconductor substrate 100 is preferably a P-type silicon substrate such as a Silicon On Insulator (SOI)

substrate. Source and drain regions 136a and 136b are separated by a prescribed interval, i.e., by a pre-estimated channel length. Channel transmission characteristics change according to voltages applied thereto. Reference numeral 134 denotes a low density doped region.

Gate electrode 128 formed of a polysilicon layer is disposed on an upper surface of semiconductor substrate 100 between source and drain regions 136a and 136b. Gate electrode 128 may be used as a word line, for example. Gate electrode 128 preferably includes conductive spacers 116 having curved sidewalls, and first gate electrode 124a, disposed in gate insulating layer 122a in a lower portion of a groove (120 of FIG. 11) between conductive spacers 116. Gate electrode 128 also includes second gate electrode 126 electrically connecting conductive spacers 116 and formed at an upper portion of first gate electrode 124a within groove 120. Conductive spacers 116 are disposed symmetrically about first and second gate electrodes 124a and 126.

Insulating stacked structure 130 is interposed between conductive spacers 116 and semiconductor substrate 100 and aligned with a sidewall edge of conductive spacer 116. Insulating stacked structure 130 is constructed by stacking a stacked first layer 102a, which can be silicon oxide layer serving as a tunnel oxide layer, a stacked second layer 104b, which can be silicon nitride layer serving as a charge trapping layer, and a stacked fifth layer 114c, which can be silicon oxide layer serving to block trapped charges. Here, stacked first layer 102a may extend over the upper surface of substrate 100 for a subsequent ion implantation process. Accordingly, respective lengths of stacked second layer 104b and stacked fifth layer 114c are equal to each other and equal to the width of a bottom of a conductive spacer 116.

Insulating spacers 132 may be further disposed adjacent to conductive spacers 116. Insulating spacers 132 are included to form source and drain regions 136a and 136b. Conductive line contacts 140 are formed adjacent to insulating spacers 132 on an upper surface of an interlayer insulating layer 138 and contact source and drain regions 136a and 136b. Conductive line contact 140 connected to drain region 136b may be a bit line, for example.

A method of manufacturing a semiconductor memory device including a self-aligned charge trapping layer according to one embodiment of the present invention will now be described with reference to FIGS. 7 through 16.

Figure 7:
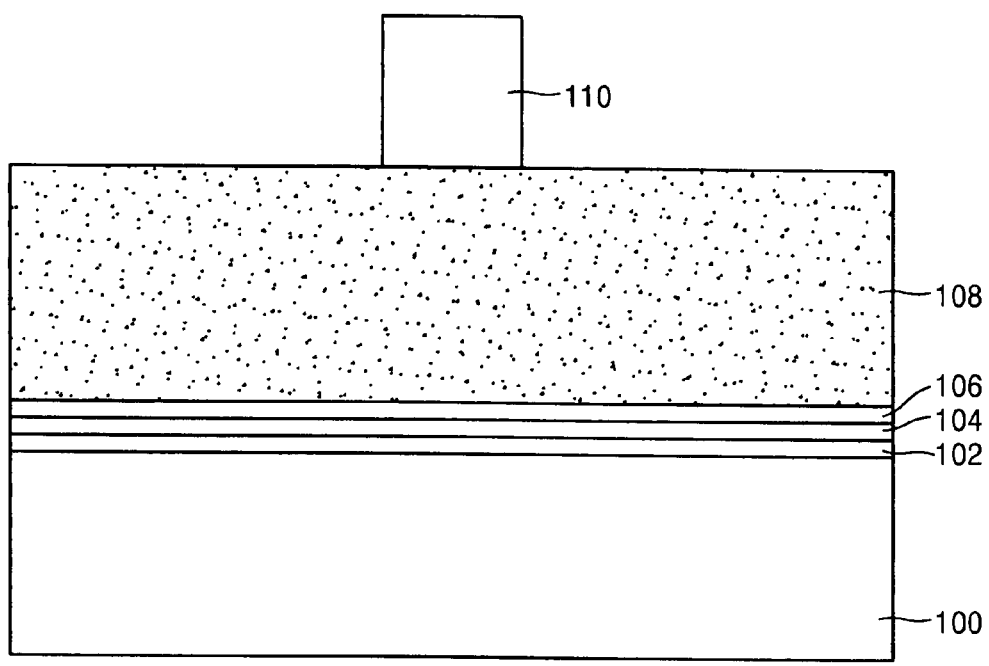
FIGS. 7 through 16 are sectional views illustrating a method of manufacturing a semiconductor memory device including a self-aligned charge trapping layer according to one embodiment of the present invention.

First, referring to FIG. 7, first layer 102, second layer 104, third layer 106, and fourth layer 108 are sequentially stacked on an upper surface of semiconductor substrate 100, e.g., a silicon substrate. For example, first layer 102 is preferably deposited to a thickness of 30 to 80 Å; second layer 104 to a thickness of 30 to 100 Å; third layer 106 to a thickness of 50 to 100 Å; and, fourth layer 108 to a thickness of 2000 to 5000 Å. Here, first layer 102 and third layer 106 are preferably formed from silicon oxide, and second layer 104 and fourth layer 108 are preferably formed from silicon nitride. Thereafter, photoresist pattern 110 is formed on an upper surface of fourth layer 108 via a general photolithography process.

Figure 8:
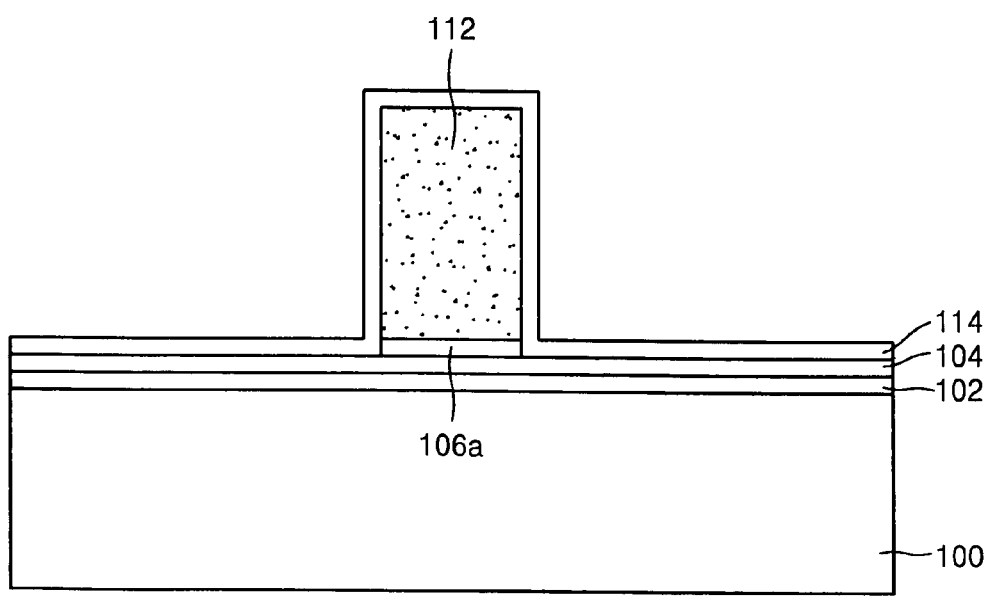

Referring to FIG. 8, fourth layer 108 is patterned using photoresist pattern 110 as an etch mask, thereby forming an intermediary material pattern 112. Fourth layer 108 is preferably patterned by dry etching. Here, third layer 106 functions as an etch stop layer. Accordingly, it is preferred that fourth layer 108 and third layer 106 have different etch selectivities. At this point in the fabrication process, the height of intermediary material pattern 112 is preferably around 2000 to 5000 Å, and identical to the thickness of fourth layer 108. Next, an exposed portion of third layer 106 is removed using a wet etching process, and fifth layer 114 is coated over the resultant surface to a thickness of about 30 to 80 Å. Therefore, a portion of an unetched third layer 106a remains below intermediary material pattern 112. Fifth layer 114 is preferably a silicon oxide layer utilized as a charge stop layer for blocking trapped charges. If third layer 106 is sufficient to function as the charge stop layer without being damaged, fifth layer 114 need not be formed.

Figure 9:
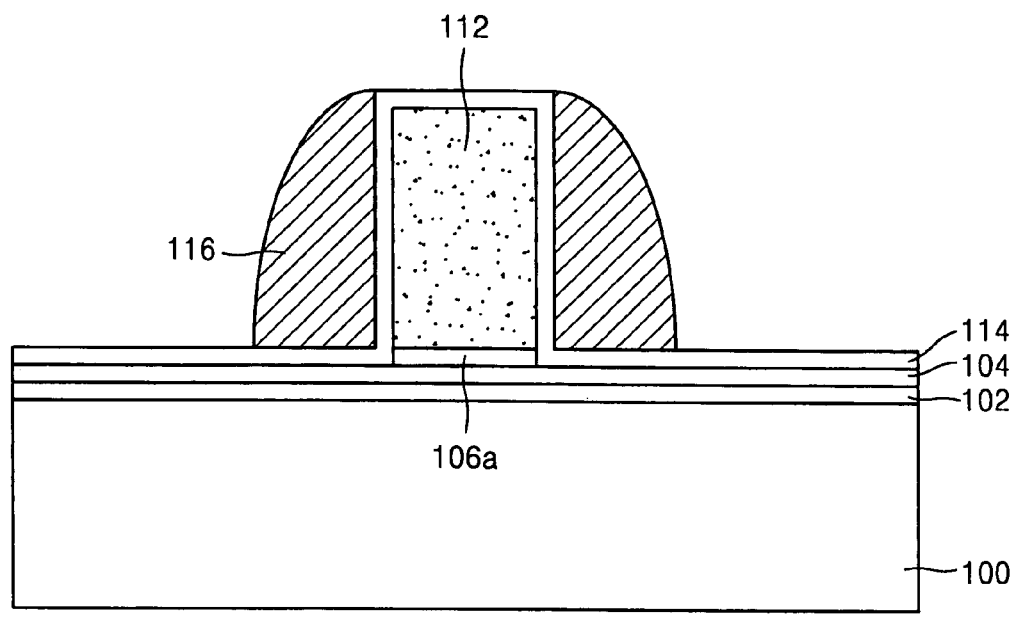

Referring to FIG. 9, conductive spacer material layer (not shown) is deposited to a thickness of about 1000 to 3000 Å on the entire exposed surface of fifth layer 114.

Then, conductive spacer material layer is subjected to anisotropic dry etching, e.g., Reactive Ion Etching (RIE), to form conductive spacers 116 on both sidewalls of fifth layer 114. Each of conductive spacers 116 includes an inner wall perpendicular to the upper surface of semiconductor substrate 100 and an arc-shaped sidewall extending from an upper edge of the inner wall. Conductive spacers 116 serve as gate electrodes for performing charge trapping. The thickness of the material that constitutes conductive spacers 116 determines the bottom lengths of conductive spacers 116. The bottom portions of conductive spacers 116 contact fifth layer 114. That is, under identical etching conditions, the thicker the material used in forming conductive spacers 116, the wider the bottom portions of conductive spacers 116 (hereafter "bottom length").

Figure 10:
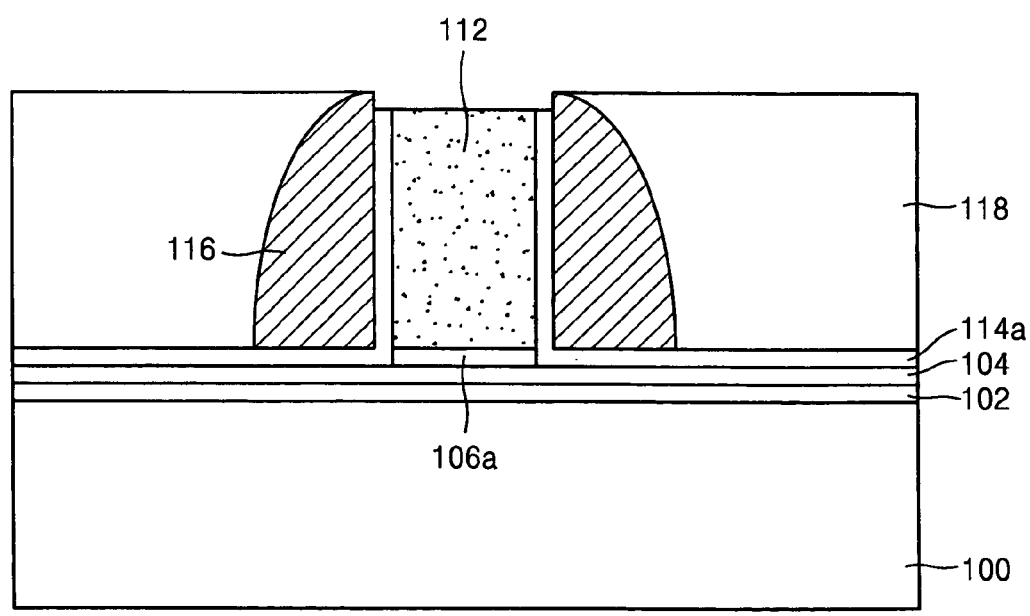

Referring to FIG. 10, interlayer insulating layer 118 is formed to a thickness of about 5000 to 15000 Å on the resultant structure. Thereafter, interlayer insulating layer 118 is planarized by Chemical Mechanical Polishing (CMP) or etch-back to interlayer insulating layer 118 using conductive spacer 116 as an etch stop. Upon being subjected to the planarizing process, fifth layer 114 on the upper surface of intermediary material pattern 112 is removed, thereby forming a separated fifth layer 114a.

Figure 11:
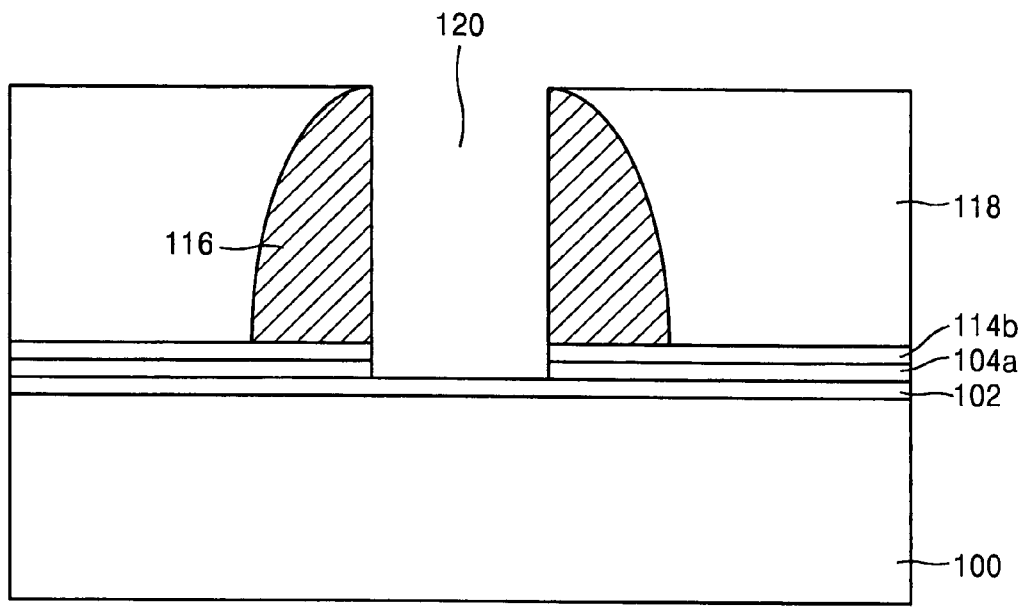

Referring to FIG. 11, intermediary material pattern 112 is removed via wet etch by means of, e.g., phosphor. Here, it is preferable that intermediary material pattern 112 has an etch selectivity over that of interlayer insulating layer 118. Uneteched third layer 106a and separated fifth layer 114a coated along inner walls of conductive spacers 116 are preferably removed using a wet etch process containing fluoride to thereby form groove 120. Then, second layer 104 along a bottom surface of groove 120 is removed via dry etch. Accordingly, separated second layer 104a and intermediary fifth layer 114b are disposed below conductive spacers 116.

Figure 12:
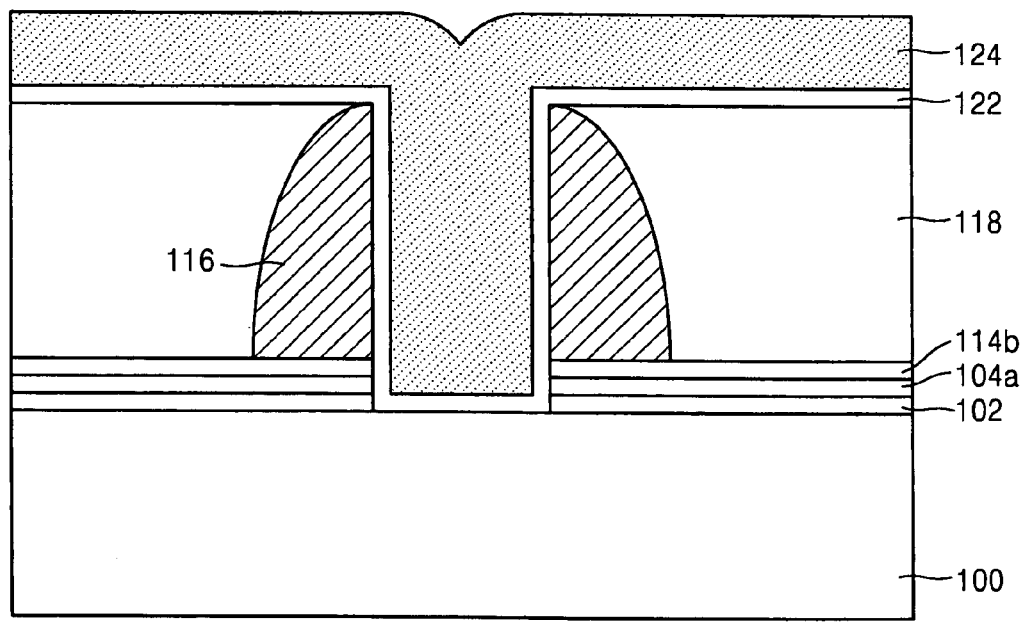

Referring to FIG. 12, a sixth layer 122 is deposited on the resultant structure to a thickness of about 30 to 150 Å, via a CVD method. Sixth layer 122 may be a silicon oxide layer utilized as a gate insulating layer. Then, annealing is executed at a temperature of between 900 and 1100° C. to improve the compactness of sixth layer 122. Thereafter, first gate electrode layer 124, e.g., a polysilicon layer, is deposited on an exposed surface of sixth layer 122 to a thickness of about 1000 to 4000 Å, thereby filling groove 120.

Figure 13:
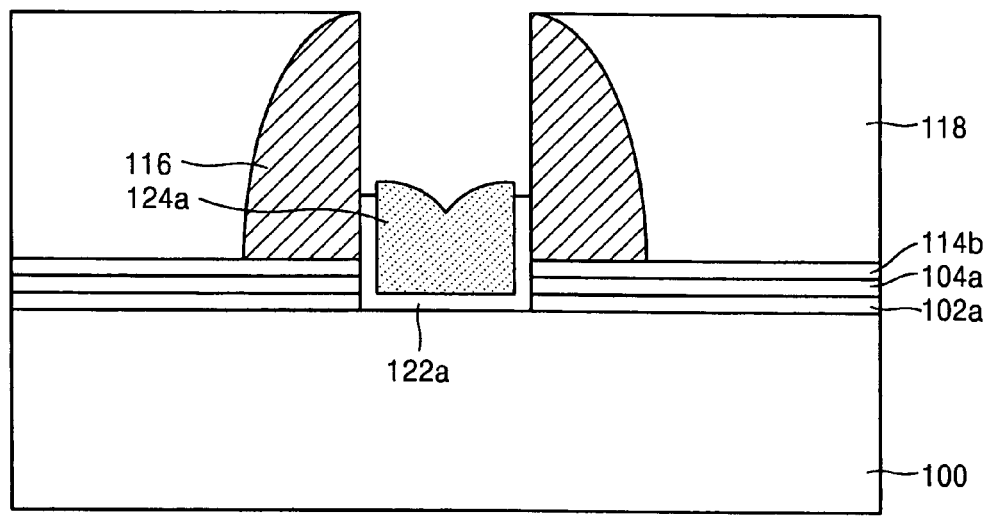

Referring to FIG. 13, first gate electrode layer 124 is selectively removed to form a first gate electrode 124a in a lower portion of groove 120. In more detail, an etchback process is first performed to remove first gate electrode layer 124 from the upper surface of interlayer insulating layer 118. Then, in a time etch manner, additional etching is performed to obtain a proper depth for groove 120. That is, the etching is performed until the height of first gate electrode layer 124 is roughly ⅓ to ⅕ that of groove 120. Then, gate insulating layer 122a having an upper surface substantially parallel with an upper surface of first gate electrode 124a is formed via wet etch. First gate electrode 124a serves as a gate electrode for forming a channel region on semiconductor substrate 100 under gate insulating layer 122a. It is preferable that first gate electrode layer 124 has an etch selectivity over that of gate insulating layer 122a.

Figure 14:
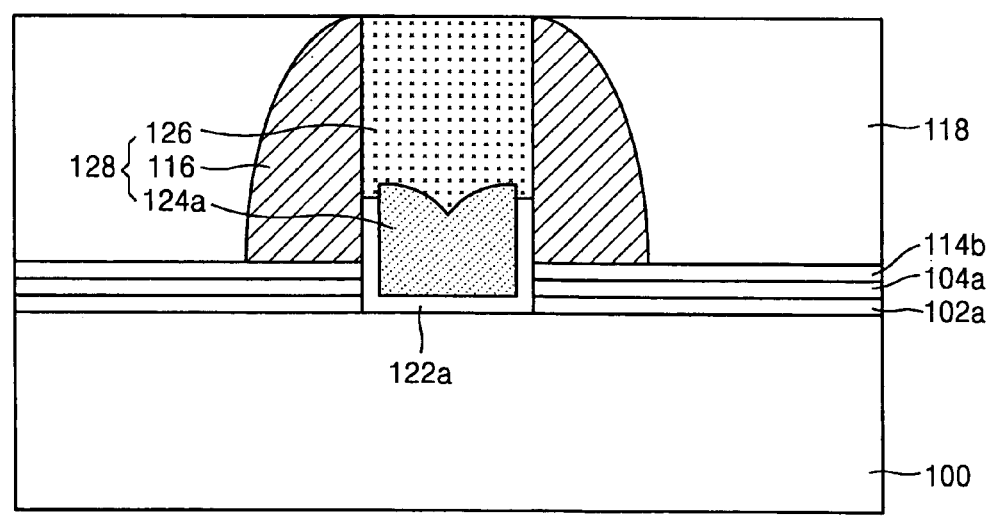

Referring to FIG. 14, second gate electrode layer (not shown), e.g., a polysilicon layer with a thickness of 500 to 3000 Å, is deposited on the entire surface of the resultant structure. Then, second gate electrode layer is planarized to form second gate electrode 126 using the upper plane of interlayer insulating layer 118 as an end stop. In other words, second gate electrode 126 is formed on the upper surface of first gate electrode 124a within groove 120. Second gate electrode 126 physically and electrically connects conductive spacer 116 and first gate electrode 124a. Conductive spacer 116, first gate electrode 124a, and second gate electrode 126 constitute gate electrode 128.

Figure 15:
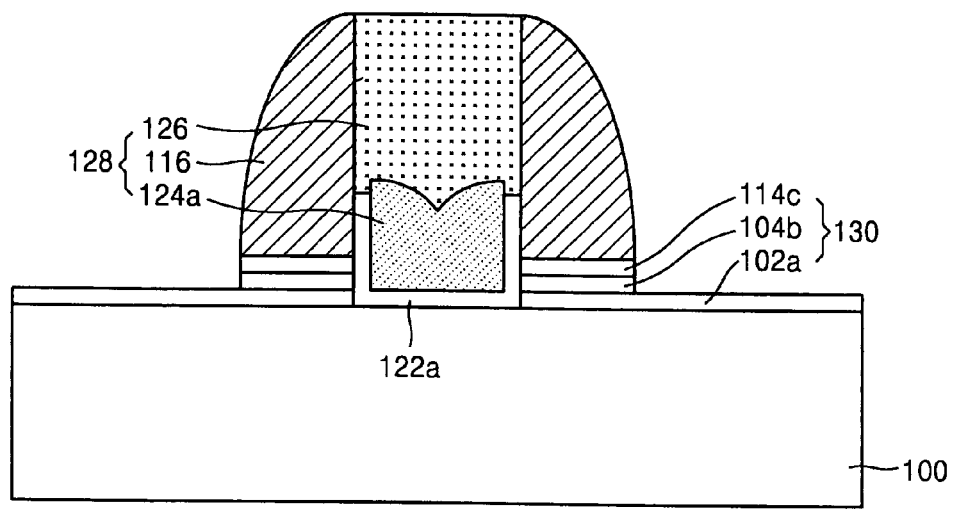

Referring to FIG. 15, after removing interlayer insulating layer 118 via wet etching or dry etching, an exposed portion of intermediary fifth layer 114b is removed via wet etching or dry etching using gate electrode 128 as an etch mask. Here, separated second layer 104a functions as an etch stop layer. Then, an exposed portion of separated second layer 104a is removed. At this time, stacked first layer 102a is not removed to block efflux of impurities during a subsequent ion implantation process. By doing so, insulating stacked structure 130 including stacked first layer 102a extending onto semiconductor substrate 100, intermediary second layer 104b, and stacked fifth layer 114c self-aligned with conductive spacer 116 is formed below conductive spacer 116. Insulating stacked structure 130 is preferably an ONO layer having a tunnel oxide layer/charge trapping layer/charge stop layer structure.

Figure 16:
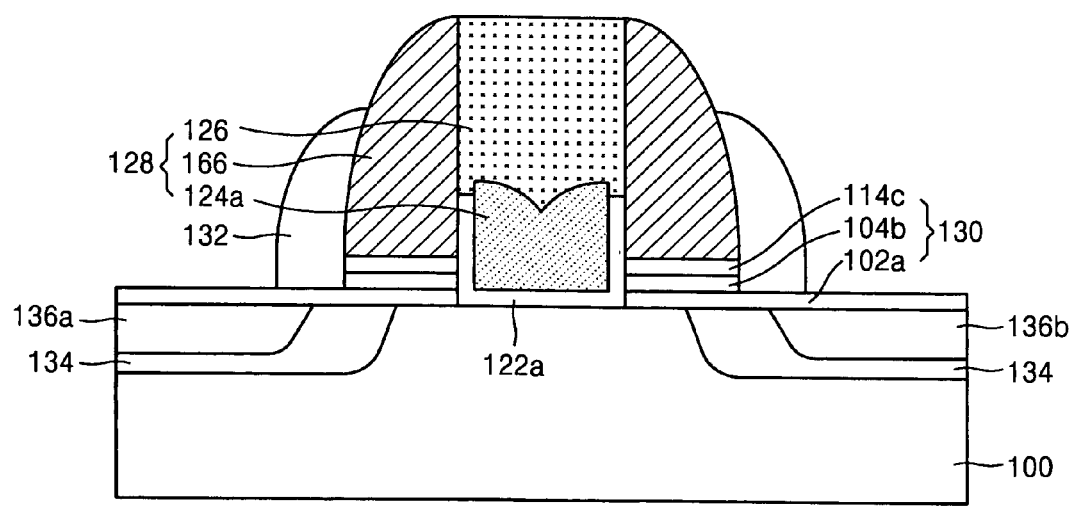

Referring to FIG. 16, N-type impurity, e.g., As-ion or P-ion, is implanted into semiconductor substrate 100 at outer edges of conductive spacers 116 with a density of about $10^{13}$ ions/cm$^2$, thereby forming junction region 134. Then, insulating spacers 132 are formed above stacked first layer 102a adjacent to conductive spacer 116. Thereafter, the N-type impurity is implanted in semiconductor substrate 100 with a density of about $10^{15}$ to $10^{16}$ ions/cm$^2$ to form source and drain regions 136a and 136b.

Then, referring to FIG. 6, an interlayer insulating layer 138 is deposited on the resultant structure. Interlayer insulating layer 138 is etched to expose source and drain regions 136a and 136b, and conductive line contact 140 is formed to contact exposed source and drain regions 136a and 136b.

According to the present embodiment, insulating stacked structure 130 is interposed between conductive spacers 116 and semiconductor substrate 100. Consequently, insulating stacked structure 130 can be formed below conductive spacers 116 without performing a separate photolithography process. Therefore, there is no misalignment generated due to photolithography.

Furthermore, lengths of insulating stacked structure 130 are controlled by a bottom length of conductive spacers 116. At this time, the spacer process is generally employed in a semiconductor manufacturing process, which is easily carried out and is capable of accurately controlling the length of the spacer. As a result, the lengths of insulating stacked structure 130 overlapping conductive spacer 116 are precisely controlled.

Moreover, although third layer 106 is preferably a silicon oxide layer and fourth layer 108 is preferably a silicon nitride layer for forming conductive spacer 116, any layer which has an etch selectivity over the other may be used.

According to the present invention, the ONO layer and semiconductor substrate are squarely positioned below the conductive spacer. Therefore, a SONOS structure including the self-aligned charge trapping layer is accurately constructed.

Since an ONO layer is self-aligned by means of a conductive spacer without requiring an additional photolithography process, the problem incurred by inconsistent lengths of the ONO layer resulting from misalignment while performing the photolithography process are resolved.

Additionally, the ONO layer is constructed using a spacer formed using conventional fabrication techniques during a general semiconductor manufacturing process. For this reason, the ONO layer is readily formed and the length of ONO layer is precisely controlled.

While the present invention has been described with reference to exemplary embodiments thereof, it will be understood by those of ordinary skill in the art that various changes in form and details may be made therein without departing from scope of the present invention as defined by the following claims.

What is claimed is:

1. A semiconductor memory device comprising:
    a gate electrode formed on a semiconductor substrate;
    a gate insulating layer separating the gate electrode from the substrate;
    a pair of conductive spacers separated across a groove, wherein each conductive spacer physically contacts the gate electrode and comprises a bottom surface; and
    charge trapping layers respectively interposed between the substrate and each one of the pair of conductive spacers, wherein each charge trapping layer is self-aligned with the bottom surface of a conductive spacer, and the length of each charge trapping layer is respectively equal to a bottom surface length for a corresponding conductive spacer.

2. The semiconductor memory device of claim 1, wherein the charge trapping layers have an equal length.

3. The semiconductor memory device of claim 1, wherein each one of the charge trapping layers comprise a nitride layer.

4. The semiconductor memory device of claim 3, wherein each one of the charge trapping layers further comprises:
    oxide layers formed above and below the nitride layer to form an ONO layer.

5. The semiconductor memory device of claim 1, wherein each one of the conductive spacers comprises a polysilicon layer.

6. The semiconductor memory device of claim 1, wherein the gate electrode further comprises:
    a first gate electrode disposed in a lower portion of the groove between the conductive spacers; and
    a second gate electrode formed in an upper portion of the groove and electrically connecting the pair of conductive spacers with the first gate electrode.

7. The semiconductor memory device of claim 6, wherein the gate insulating layer is formed laterally over the substrate and vertically up a portion of inner sidewalls defined by the conductive spacers; and,
    wherein the first gate electrode is vertically formed in the lower portion of the groove.

8. The semiconductor memory device of claim 6, wherein the first gate electrode completely covers the lower portion of the groove.

9. The semiconductor memory of claim 6, wherein the conductive spacers are separated across a predetermined distance.

10. The semiconductor memory of claim 6, wherein the first gate electrode and the second gate electrode are formed from a material selected from a group of materials consisting of polysilicon, Al, W, WNx, Ta, TaN, Ru, Ti, TiN, Pt and any combination of these materials.

11. A semiconductor memory device comprising:
a gate insulating layer disposed in a groove exposing a semiconductor substrate, the gate insulating layer comprising a bottom surface disposed on the exposed portion of the semiconductor substrate, and lateral surfaces extending vertically on inner walls of the groove;
a pair of conductive spacers disposed on opposite sides of the gate insulating layer and separated across the groove, wherein each conductive spacer comprises a bottom surface, an inner edge formed towards the groove and an outer edge formed away from the groove;
a first gate electrode disposed in the groove and substantially between the lateral surfaces of the gate insulating layer, such that the first gate electrode is separated from the pair of conductive spacers, wherein an upper surface of the first gate electrode has a curved shape;
a second gate electrode disposed in the groove on the first gate electrode in physical contact with the pair of conductive spacers; and,
insulating stack structures respectively disposed between a corresponding one of the pair of conductive spacers and the semiconductor substrate, each insulating stack structure comprising an outer edge self-aligned with the outer edge of the corresponding one of the pair of conductive spacers and comprising a charge trapping nitride layer disposed between first and second oxide layers.

12. The semiconductor memory device of claim 11, wherein insulating stack structures each have a similar length.

13. A semiconductor memory device comprising:
a pair of conductive spacers seperated by a groove, each conductive spacer having a bottom surface and being electrically coupled to a gate electrode;
a gate insulating layer form on a substrate in the groove;
wherein the gate electrode comprises a first gate electrode formed on the gate insulating layer and having a curved upper surface, and a second gate electrode formed on the curved upper surface of the first gate electrode; and
charge trapping layers respectively interposed between the substrate and each conductive spacers, and wherein each charge trapping layer is self-aligned with the bottom surface of a conductive spacer.

14. The semiconductor memory device of claim 13, wherein the charge trapping layers have an equal length.

15. The semiconductor memory device of claim 13, wherein the gate insulating layer is formed laterally over the substrate and vertically up a portion of inner sidewalls of the conductive spacers to physically separate the conductive spacers from the first gate electrode.

16. The semiconductor memory device of claim 13, wherein the conductive spacers are formed in physical contact with second gate electrode but physically separated from the first gate electrode.

17. The semiconductor memory device of claim 13, wherein each one of the charge trapping layers comprises an ONO layer.

* * * * *